US007411335B2

(12) United States Patent
Eckert et al.

(10) Patent No.: US 7,411,335 B2
(45) Date of Patent: Aug. 12, 2008

(54) SONIC OR ULTRASONIC TRANSDUCER

(75) Inventors: Manfred Eckert, Todtnau (DE); Frank Volz, Freiburg (DE)

(73) Assignee: Endress + Hauser GmbH + Co. KG, Maulburg (DE)

( * ) Notice: Subject to any disclaimer, the term of this patent is extended or adjusted under 35 U.S.C. 154(b) by 4 days.

(21) Appl. No.: 10/573,420

(22) PCT Filed: Sep. 20, 2004

(86) PCT No.: PCT/EP2004/010526

§ 371 (c)(1),
(2), (4) Date: Feb. 5, 2007

(87) PCT Pub. No.: WO2005/031274

PCT Pub. Date: Apr. 7, 2005

(65) Prior Publication Data

US 2007/0273249 A1 Nov. 29, 2007

(30) Foreign Application Priority Data

Sep. 25, 2003 (DE) ................................ 103 44 741

(51) Int. Cl.
*H04R 17/00* (2006.01)
*H01L 41/08* (2006.01)

(52) U.S. Cl. ........................ 310/322; 310/326; 310/334

(58) Field of Classification Search ................. 310/322, 310/326, 327, 334
See application file for complete search history.

(56) References Cited

U.S. PATENT DOCUMENTS

| | | | | |
|---|---|---|---|---|
| 4,686,409 | A * | 8/1987 | Kaarmann et al. | .......... 310/358 |
| 5,195,373 | A | 3/1993 | Light | |
| 5,583,293 | A | 12/1996 | Floegel | |
| 5,664,456 | A | 9/1997 | Eckert | |
| 2002/0180316 | A1 | 12/2002 | Linden | |

FOREIGN PATENT DOCUMENTS

| | | |
|---|---|---|
| DE | 25 37 788 | 3/1977 |
| DE | 25 41 492 | 3/1977 |

(Continued)

OTHER PUBLICATIONS

W. Schatt, “Einfuhrung in die Werkstoffwissenchaft”, Germany, 1987, p. 332.

(Continued)

*Primary Examiner*—Thomas M Dougherty
(74) *Attorney, Agent, or Firm*—Bacon & Thomas, PLLC

(57) ABSTRACT

A sonic or ultrasonic transducer, which is embodied as a radial oscillator. So that the sonic or ultrasonic transducer can be used at high temperatures, a matching layer is located between the radial oscillator and the atmosphere into which the ultrasonic signals are transmitted The matching layer is made from a material that has a dimensional stability up to a temperature which lies above the temperature at the installation location of the sonic or ultrasonic transducer. Furthermore, the matching layer is selected such that its material-specific coefficient of thermal expansion is greater than that of the materials of a piezoelectric unit and a coupling ring, and that the modulus of elasticity of the material of the matching layer is at least one order of magnitude smaller than that of the piezoelectric unit and/or the coupling ring.

8 Claims, 1 Drawing Sheet

FOREIGN PATENT DOCUMENTS

| | | | | |
|---|---|---|---|---|
| DE | 1530347 | | | 10/1978 |
| DE | 0116823 | | * | 8/1984 |
| DE | 43 11 963 | C2 | | 10/1994 |
| DE | 196 21 760 | A1 | | 1/1997 |
| DE | 195 38 696 | A1 | | 4/1997 |
| DE | 198 20 419 | A1 | | 11/1999 |
| DE | 203 03 461 | U1 | | 7/2003 |
| EP | 0 615 471 | B1 | | 8/1995 |
| EP | 0 985 916 | A1 | | 3/2000 |
| JP | 11-90098 | | * | 7/1989 |
| WO | WO-94/07615 | | * | 10/1992 |

OTHER PUBLICATIONS

H. Blumenauer, “Werkstoffprufung”, Leipzig, 1977, pp. 32, 374.

H. Kuchling, “Taschenbuch der Physik”, Leipzig, 1989, pp. 591-593.

E. Hornbogen, Werkstoff-Aufbau und Eigenschaften, 2002, p. 9, 127, 212.

G+H Montage G+H Isover, “Warmetechnisches Handbuch”, 1996, p. 74.

* cited by examiner

SONIC OR ULTRASONIC TRANSDUCER

TECHNICAL FIELD

The invention relates to a sonic or ultrasonic transducer having a disc-shaped piezoelectric unit, a ring-shaped, coupling element which surrounds the piezoelectric unit with a form- and force-fit, a matching layer which is arranged in front of the piezoelectric unit in the direction of radiation of the sonic and ultrasonic waves, and a transmitting/receiving unit which excites the piezoelectric unit to execute radial oscillations. The piezoelectric unit is preferably a piezoceramic disc. The ultrasonic transducer is preferably a part of a sensor for determining and/or monitoring the fill level of a process medium located in a container.

BACKGROUND DISCUSSION

A sonic or ultrasonic transducer, as described above, is already known from EP 0 615 471 B1. The known transducer especially distinguishes itself in that, when the dimensions of the piezoceramic disc are small, the transducer has a reduced operating frequency, as compared with the radial resonance frequency of the piezoceramic disc alone. This is achieved through a metal ring which surrounds the lateral surface of the piezoceramic disc with a form- and force-fit. For this, the metal ring is preferably assembled with the piezoceramic disc by shrink-fitting. Because of the coupling, the combination of the piezoceramic disc and the coupling ring behaves like a radial oscillator; especially, the surface of the radial oscillator, i.e. the surface formed from both components, acts as radiating surface for the sonic or ultrasonic waves.

SUMMARY OF THE INVENTION

An object of the invention is to provide a sonic or ultrasonic transducer, especially one embodied as a radial oscillator, for use in high temperature zones.

This object is achieved by the following combination of features: That the matching layer is made from a material having a dimensional stability up to a temperature lying above the temperature at the installation location of the sonic or ultrasonic transducer; the material-specific coefficient of thermal expansion of the material of the matching layer is greater than the coefficient of thermal expansion of the materials of the piezoelectric unit and/or the coupling ring; and the modulus of elasticity of the material of the matching layer is at least an order of magnitude smaller than the modulus of elasticity of the piezoelectric unit and/or the coupling ring.

It is preferred that the matching layer be made of a hard foam material. An example of a hard foam material with low density is the PMI-hard foam material Rohacell of the firm Röhm. This hard foam material is available in densities from 30 to 200 kg/m$^3$. By using a foam material with a low density, an effective impedance matching to the air or atmosphere, in which the sonic or ultrasonic transducer is used, can be achieved. Since the foam material has a relatively high intrinsic damping, the matching layer contributes to a reduction in post-oscillation of the sonic or ultrasonic transducer.

In accordance with an advantageous embodiment of the sonic or ultrasonic transducer of the invention, it is provided that the matching layer is made up of multiple plies, having at least partially different densities. In this connection especially, it is provided that the ply of the matching layer having the highest density is arranged in the immediate vicinity of the radial oscillator, while the ply of the matching layer with the lowest density has the greatest separation from the radial oscillator. Through such an embodiment, an improvement can be achieved in the ratio between the actual echo signal and the disturbance signals generated by the post-oscillation.

If the foam material has, for example, a dimensional stability up to 180° C., then the sonic or ultrasonic transducer functions consistently over a range of −40° C. to 150° C. Since the material-specific coefficient of thermal expansion of the matching layer material is greater than that of the materials of the piezoelectric unit and/or the coupling ring, and since the modulus of elasticity of the material of the matching layer is at least an order of magnitude smaller than that of the piezoelectric unit and/or the coupling ring, a very good connection between the matching layer and the radial oscillator is assured over a large temperature range.

In accordance with an advantageous further development of the apparatus of the invention, the coupling ring is made of metal or ceramic. If the coupling ring is made of metal, then it is possible to accomplish the assembly of coupling ring onto the lateral surface of the piezoceramic disc by means of a shrink-fitting process.

As a result of the high moisture sensitivity of the foam material from which the matching layer preferably is formed, it is necessary to effectively protect the matching layer from environmental influences, especially from the diffusion of water vapor and from other foreign matter. The required encapsulation is achieved, in accordance with a preferred embodiment of the apparatus of the invention, via a combination: This is formed from the aforementioned metal ring, which is arranged in the outer area of the piezoceramic disc, and a thin protective foil, which covers the matching layer on its side in the direction of radiation. The protective foil is preferably a metal foil made, for example, of high-grade steel, e.g. a stainless, high-grade steel. Furthermore, the protective foil is preferably adhered to the matching layer, or is securely connected thereto by other means, and, in this way, simultaneously increases the mechanical strength of the matching layer.

An advantageous embodiment of the apparatus of the invention provides a housing, in which the piezoelectric unit is arranged along with the coupling ring and matching layer. Furthermore, a potting compound is provided which is arranged at least in some areas between the matching layer, the piezoelectric unit, the coupling ring, and the inner wall of the housing. In other words, the potting compound fills the rear area of the housing completely, or at least to a large extent. The potting compound is an elastomeric potting compound, for example.

To prevent the penetration of moisture or other foreign matter through the rear area of the sensor, a diffusion barrier is provided, which is arranged on the potting compound facing away from the direction of radiation. The diffusion barrier is again preferably a metal foil.

BRIEF DESCRIPTION OF THE DRAWING

The invention will now be described in greater detail on the basis of the drawing, FIG. 1 of which shows as follows.

DESCRIPTION OF THE DRAWING

Figure 1:
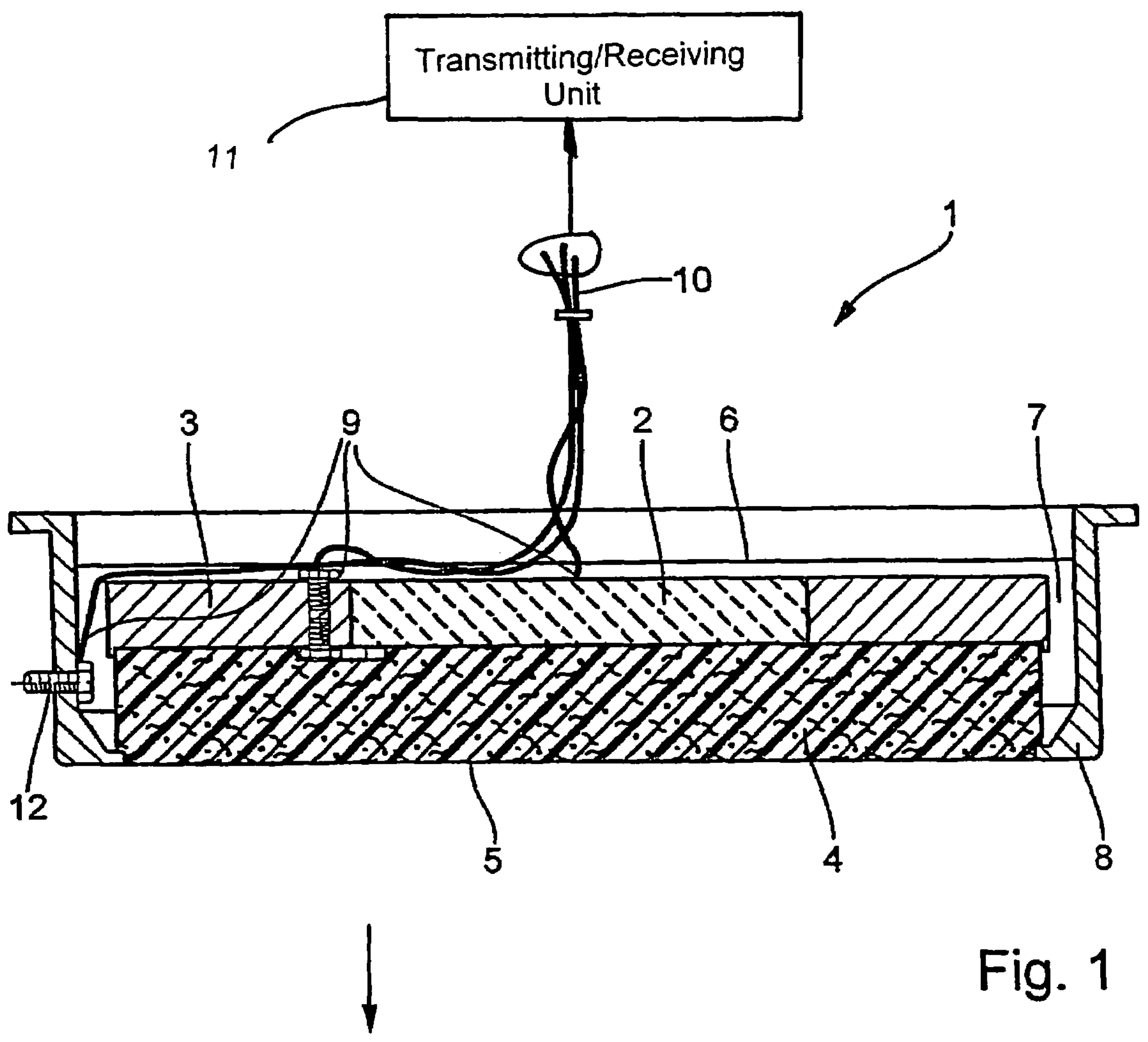
FIG. 1 in section, a preferred embodiment of the sonic or ultrasonic transducer of the invention.

The sonic or ultrasonic transducer illustrated in FIG. 1 is composed of a round, piezoceramic disc 2, whose lateral surface is surrounded by a coupling element 3 with a form- and force-fit. If the coupling ring 3 is a metal ring made of aluminum, for example, it can be assembled with the piezoelectric unit 2 by shrink-fitting. For this, the coupling ring 3, in a heated condition, is set around the piezoceramic disc 2. As the coupling ring cools, it contracts and encloses the piezoceramic disc 2 with a form- and force-fit.

An alternating voltage is applied to the piezoelectric unit 2 via the connection lines 10, whereby the piezoelectric unit 2, and the coupling ring 3 which is connected with it, are excited to radial oscillations. The radial oscillator is thus made up of two components. Naturally, the radial oscillator can also be simply a piezoceramic disc. The thickness of the matching layer 4, as arranged on the radial oscillator (formed of the piezoelectric unit 2 and the coupling ring 3) on the surface thereof facing in the direction of radiation of the sonic or ultrasonic waves, is selected such that the sonic or ultrasonic waves are radiated essentially only in the desired direction of radiation.

Furthermore, the matching layer 4 is designed such that the sonic or ultrasonic transducer 1 and the related sensor are suitable for use in high-temperature zones. For this, the matching layer 4 is made of a material which has a dimensional stability up to a temperature which lies above the temperature at the installation location of the sonic or ultrasonic transducer 1. Furthermore, the material-specific coefficient of thermal expansion of the material of the matching layer 4 is greater than that of the materials of the piezoelectric unit 2 and/or the coupling ring 3. Also, the modulus of elasticity of the material of the matching layer is at least one order of magnitude smaller than that of piezoelectric unit 2 and/or the coupling ring 3. As already stated, the matching layer 4 is preferably made of a hard foam material.

The radial oscillator with piezoelectric unit 2, coupling ring 3, and matching layer 4, is arranged in a housing 8. The region between the lateral surface of the radial oscillator and the inner wall of the housing 8, as well as the region above the radial oscillator, on the surface thereof facing away from the direction of radiation of the sonic or ultrasonic waves, are both filled with a potting compound 7. In addition to protecting the radial oscillator from penetrating moisture or other foreign matter, the potting compound 7 also serves to optimize how the sound or ultrasound of the radial oscillator decays. The potting compound 7 is, especially, a silicone potting compound, in which ceramic particles and/or air pockets are embedded. Here, the air pockets serve to reduce the density of the potting compound 7, which leads to a better damping behavior of the radial oscillator.

A protective foil 5, preferably a high-grade steel foil, serves as a diffusion barrier facing in the direction of radiation of the sonic or ultrasonic waves. By means of an additional diffusion barrier 6, which is arranged facing away from the direction of the sonic and ultrasonic waves, an optimal encapsulation of the radial oscillator against the atmosphere and/or the process is achieved. The radial oscillator is thus encased on all sides, and, so, effectively protected from moisture and other foreign matter.

Contacts 9 are connected to the coupling ring 3, the piezoelectric unit 2, a ground connection 12, and connecting lines 10. The connecting lines 10 connect with the transmitting/receiving unit 11.

It is understood that the invention is not limited to the form of radial oscillator described here, based on a piezoceramic disc and coupling ring. In principle the matching layer of the invention can be used in connection with any radial oscillator, thus also with the sonic or ultrasonic transducer described in DE 25 41 492 B, for example.

The invention claimed is:

1. A sonic or ultrasonic transducer, comprising:

a disc-shaped piezoelectric unit; a ring-shaped coupling element surrounding said piezoelectric unit with a form- and force-fit;

a matching layer arranged in front of said piezoelectric unit in the direction of radiation of the sonic or ultrasonic waves; and a transmitting/receiving unit which excites said piezoelectric unit to execute radial oscillations, wherein:

said matching layer is made of a material which has dimensional stability up to a temperature lying above the temperature at the installation location of the sonic or ultrasonic transducer; the material-specific coefficient of thermal expansion of the material of said matching layer is greater than that of the materials of said piezoelectric unit and/or said coupling element; and the modulus of elasticity of the material of said matching layer is at least one order of magnitude smaller than that of said piezoelectric unit and/or said coupling ring element.

2. The sonic or ultrasonic transducer as claimed in claim 1, wherein:

said matching layer is made of a hard foam material.

3. The sonic or ultrasonic transducer as claimed in claim 1, wherein:

said coupling element is made of metal or ceramic.

4. The sonic or ultrasonic transducer as claimed in claim 1, further comprising:

a protective foil provided in front of said matching layer in the direction of radiation of the sonic or ultrasonic waves, and is arranged such that it protects said matching layer, on the side of said matching layer facing in the direction of radiation, from the penetration of moisture and other foreign matter.

5. The sonic or ultrasonic transducer as claimed in claim 4, wherein:

said protective foil is made of metal.

6. The sonic or ultrasonic transducer as claimed in claim 1, further comprising:

a housing provided, in which said matching layer and said piezoelectric unit with said coupling element are arranged; and a potting compound provided, which is arranged at least in some areas between said matching layer, said piezoelectric unit, said coupling element, and the inner wall of said housing.

7. The sonic or ultrasonic transducer as claimed in claim 1, wherein:

said potting compound is an elastomeric potting compound.

8. The sonic or ultrasonic transducer as claimed in claim 7, further comprising:

a diffusion barrier provided, which is arranged on said potting compound facing away from the direction of radiation.

* * * * *